US012212940B2

(12) United States Patent
Takemoto

(10) Patent No.: US 12,212,940 B2
(45) Date of Patent: Jan. 28, 2025

(54) ACOUSTIC PROCESSING APPARATUS

(71) Applicant: Panasonic Intellectual Property Management Co., Ltd., Osaka (JP)

(72) Inventor: Makoto Takemoto, Kanagawa Ken (JP)

(73) Assignee: PANASONIC AUTOMOTIVE SYSTEMS CO., LTD., Kanagawa (JP)

(*) Notice: Subject to any disclaimer, the term of this patent is extended or adjusted under 35 U.S.C. 154(b) by 219 days.

(21) Appl. No.: 18/086,471

(22) Filed: Dec. 21, 2022

(65) Prior Publication Data

US 2023/0131342 A1 Apr. 27, 2023

Related U.S. Application Data

(63) Continuation of application No. PCT/JP2021/023843, filed on Jun. 23, 2021.

(30) Foreign Application Priority Data

Sep. 11, 2020 (JP) ................. 2020-153325

(51) Int. Cl.
*H04R 3/00* (2006.01)
*G10L 21/0208* (2013.01)
*H03F 1/26* (2006.01)

(52) U.S. Cl.
CPC .......... *H04R 3/005* (2013.01); *G10L 21/0208* (2013.01); *H03F 1/26* (2013.01); *H04R 3/002* (2013.01); *H03F 2200/264* (2013.01)

(58) Field of Classification Search
CPC .... H04R 3/005; H04R 2499/13; H04R 3/002; H04R 1/406; G10L 21/0208; G10L 2015/223; G10L 21/0272; G10L 15/22; H03F 1/26; H03F 2200/264

USPC ............ 381/86, 92, 389, 111, 71.4, 58
See application file for complete search history.

(56) References Cited

U.S. PATENT DOCUMENTS

2008/0240456 A1 10/2008 Sakamoto et al.

FOREIGN PATENT DOCUMENTS

| CN | 209072766 U | * | 7/2019 |
|----|-------------|---|--------|
| JP | H11-355881 A | | 12/1999 |
| JP | 2008-247221 A | | 10/2008 |
| JP | 2010-283506 A | | 12/2010 |
| JP | 2015-219032 A | | 12/2015 |

OTHER PUBLICATIONS

International Search Report (including English Language Translation), mailed Sep. 7, 2021, by the Japan Patent Office (JPO), in International Application No. PCT/JP2021/023843.

* cited by examiner

*Primary Examiner* — Norman Yu
(74) *Attorney, Agent, or Firm* — Greenblum & Bernstein, P.L.C.

(57) ABSTRACT

An acoustic processing apparatus according to the present disclosure includes one or more microphones, a first voice processing unit, and a second voice processing unit. The second voice processing unit is connectable between the microphones and the first voice processing unit. The second voice processing unit includes an operational amplifier, an output terminal, an attenuator, and a transistor. The output terminal is connectable to the first voice processing unit. The attenuator is electrically connected between an output node of the operational amplifier and the output terminal.

8 Claims, 4 Drawing Sheets

ACOUSTIC PROCESSING APPARATUS

CROSS-REFERENCE TO RELATED APPLICATIONS

This application is a continuation of International Application No. PCT/JP2021/023843, filed on Jun. 23, 2021, which is based on the Japanese Patent Application No. 2020-153325, filed on Sep. 11, 2020, the entire contents of which are incorporated herein by reference.

FIELD

The present disclosure relates to an acoustic processing apparatus.

BACKGROUND

An acoustic processing apparatus mounted in a vehicle performs signal processing in a handsfree call, voice recognition, and the like, and performs noise control such as suppression of noise in a vehicle interior and active noise control (ANC) by using a microphone.

In an acoustic processing apparatus, a microphone for signal processing and a microphone for noise control are often configured as separate modules. In order to improve performances of the signal processing and the noise control, the number of microphones tends to increase. Wiring concentration on a voice processing unit in the subsequent stage may hinder arrangement of wire harnesses.

DETAILED DESCRIPTION

An acoustic processing apparatus according to the present disclosure includes one or more microphones, a first voice processing unit, and a second voice processing unit. The second voice processing unit is connectable between some or all of the microphones and the first voice processing unit. The second voice processing unit includes an operational amplifier, an output terminal, an attenuator (ATT), and a transistor. The output terminal is connectable to the first voice processing unit. The attenuator is electrically connected between an output node of the operational amplifier and the output terminal.

According to an acoustic processing apparatus of the present disclosure, the number of microphones can be reduced.

An embodiment of an acoustic processing apparatus according to the present disclosure will be described below with reference to the drawings.

Embodiment

The acoustic processing apparatus according to the embodiment is mounted in a vehicle and includes a microphone. A microphone in a vehicle is used for wide varieties such as a handsfree call, voice recognition, suppression of noise in a vehicle interior, and ANC. The acoustic processing apparatus uses microphones to perform signal processing in the handsfree call, the voice recognition, and the like, and perform noise control such as the suppression of noise in a vehicle interior and active noise control (ANC).

In an acoustic processing apparatus, a microphone for signal processing and a microphone for noise control are often configured as separate modules. The number of microphones tends to increase in order to improve the performances of the signal processing and the noise control.

Figure 4:
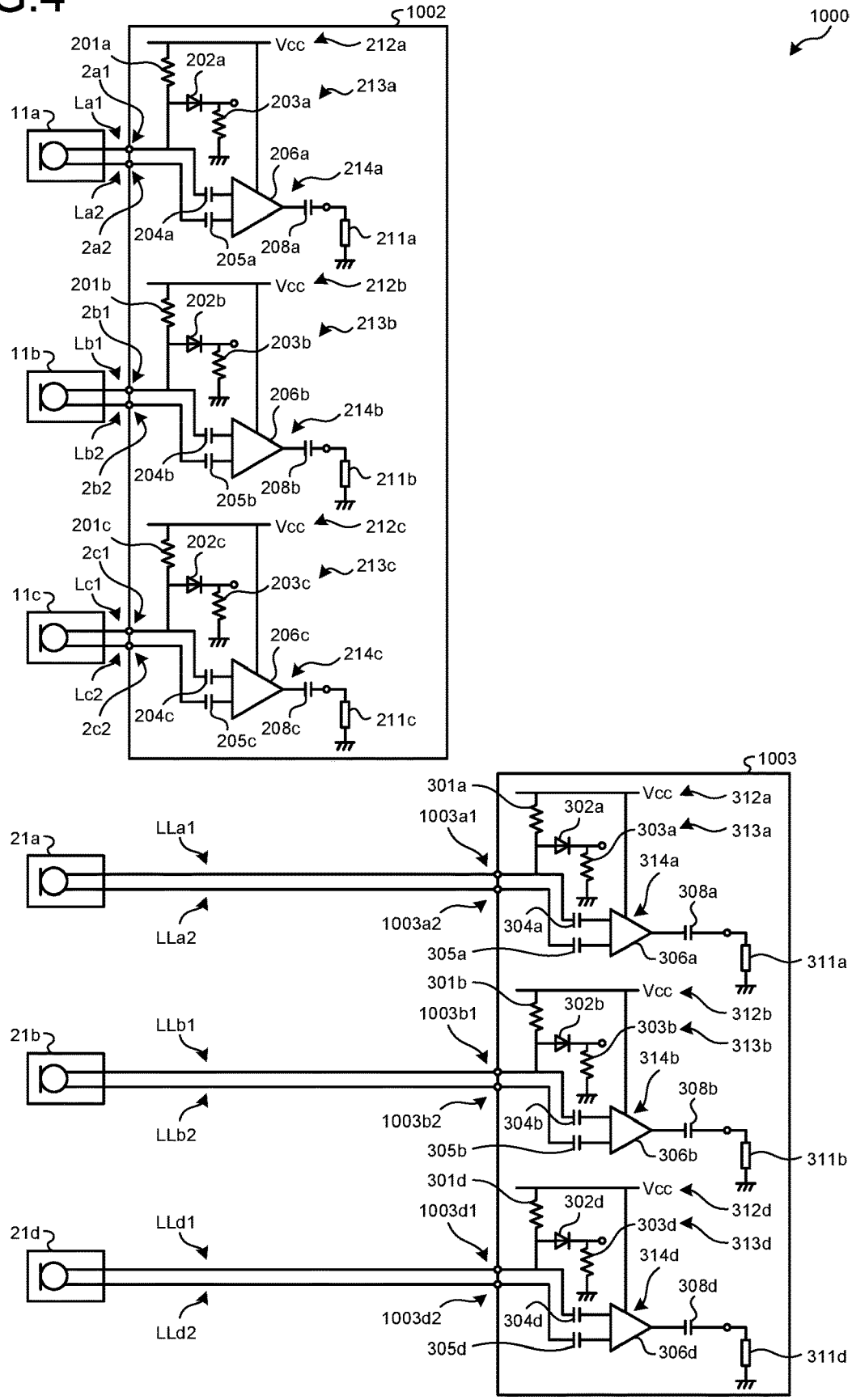
FIG. 4 is a circuit diagram illustrating a configuration of an acoustic processing apparatus in a case where a microphone for voice recognition and a microphone for noise control are separate modules.

For example, an acoustic processing apparatus 1000 in FIG. 4 includes microphones 11a, 11b, and 11c, microphones 21a, 21b, and 21d, an ANC unit 1002, and a signal processing unit 1003. FIG. 4 is a circuit diagram illustrating a configuration of the acoustic processing apparatus 1000 in a case where the microphone for signal processing and the microphone for noise control are separate modules.

The microphones 11a, 11b, and 11c are microphone modules for ANC, and have characteristics required for the ANC unit 1002. The microphones 21a, 21b, and 21d are microphone modules for signal processing, and have characteristics required for the signal processing unit 1003. Both the microphones 11a, 11b, and 11c and the microphones 21a, 21b, and 21d are of types to which power is supplied from the outside for operation, and are, for example, capacitor-type microphones.

Power is supplied to the microphones 11a, 11b, and 11c by a phantom power supply method. Signal lines La1, La2, Lb1, Lb2, Lc1, and Lc2 connecting the microphones 11a, 11b, and 11c with the ANC unit 1002 are respectively used for both a power supply and a microphone output.

Power is supplied to the microphones 21a, 21b, and 21d by the phantom power supply method. Signal lines LLa1, LLa2, LLb1, LLb2, LLd1, and LLd2 connecting the microphones 21a, 21b, and 21d with the signal processing unit 1003 are respectively used for both a power supply and a microphone output.

The ANC unit 1002 includes input terminals 2a1, 2a2, 2b1, 2b2, 2c1, and 2c2, and phantom power supply circuits 212a, 212b, and 212c. The phantom power supply circuits 212a, 212b, and 212c have power supply voltages Vcc, and respectively have resistors 201a, 201b, and 201c. The resistors 201a, 201b, and 201c are connected to the power supply voltages Vcc at ends thereof. The resistors 201a, 201b, and 201c are connected at the other ends to the microphones 11a, 11b, and 11c via the input terminals 2a1, 2b1, and 2c1 and the signal lines La1, Lb1, and Lc1, respectively. This causes the phantom power supply circuits 212a, 212b, and 212c to supply power supply voltages to the microphones 11a, 11b, and 11c, respectively. Furthermore, the microphones 11a, 11b, and 11c supply voice signals to the ANC unit 1002.

The signal processing unit 1003 includes input terminals 1003a1, 1003a2, 1003b1, 1003b2, 1003d1, and 1003d2, and phantom power supply circuits 312a, 312b, and 312d. The phantom power supply circuits 312a, 312b, and 312d have power supply voltages Vcc, and respectively have resistors 301a, 301b, and 301d. The resistors 301a, 301b, and 301d are connected to the power supply voltages Vcc at ends thereof. The resistors 301a, 301b, and 301d are connected at the other ends to the microphones 21a, 21b, and 21d via the input terminals 1003a1, 1003b1, and 1003d1 and the signal lines LLa1, LLb1, and LLd1, respectively. This causes the phantom power supply circuits 312a, 312b, and 312d to supply power supply voltages to the microphones 21a, 21b, and 21d, respectively. Furthermore, the microphones 21a, 21b, and 21d supply voice signals to the signal processing unit 1003.

Furthermore, the ANC unit 1002 includes disconnection detection circuits 213a, 213b, and 213c, amplifier circuits 214a, 214b, and 214c, and voice processors 211a, 211b, and 211c. The disconnection detection circuits 213a, 213b, and 213c include diodes 202a, 202b, and 202c and resistors 203a, 203b, and 203c, respectively. Anodes of the diodes 202a, 202b, and 202c are connected to nodes between the other ends of the resistors 201a, 201b, and 201c and the signal lines La1, Lb1, and Lc1, and cathodes thereof are connected to ends of the resistors 203a, 203b, and 203c. The other ends of the resistors 203a, 203b, and 203c are connected to the ground potential. Cathode voltages of the diodes 202a, 202b, and 202c change depending on connection states (normal, open, and short circuit) of the microphones 11a, 11b, and 11c via the signal lines La1, Lb1, and Lc1. That is, the connection states (normal, open, and short circuit) of the microphones 11a, 11b, and 11c can be detected by monitoring the cathode voltages of the diodes 202a, 202b, and 202c.

The amplifier circuits 214a, 214b, and 214c include capacitors 204a, 204b, and 204c, capacitors 205a, 205b, and 205c, operational amplifiers 206a, 206b, and 206c, and capacitors 208a, 208b, and 208c, respectively. Each of the operational amplifiers 206a, 206b, and 206c operates by receiving the power supply voltage Vcc at a power supply node. The operational amplifiers 206a, 206b, and 206c amplify the levels of the voice signals transmitted from the signal lines La1, Lb1, and Lc1 via the capacitors 204a, 204b, and 204c and the capacitors 205a, 205b, and 205c to predetermined levels, respectively. The operational amplifiers 206a, 206b, and 206c supply the amplified signals to the voice processors 211a, 211b, and 211c via the capacitors 208a, 208b, and 208c, respectively. Each of the voice processors 211a, 211b, and 211c extracts a noise component from the supplied signal, and generates a noise cancellation signal having a phase opposite to that of the noise component. Each of the voice processors 211a, 211b, and 211c outputs noise cancellation sound in accordance with the noise cancellation signal from a speaker (not illustrated).

The signal processing unit 1003 includes disconnection detection circuits 313a, 313b, and 313d, amplifier circuits 314a, 314b, and 314d, and voice processors 311a, 311b, and 311d. The disconnection detection circuits 313a, 313b, and 313d include diodes 302a, 302b, and 302d and resistors 303a, 303b, and 303d, respectively. Anodes of the diodes 302a, 302b, and 302d are connected to nodes between the other ends of the resistors 301a, 301b, and 301d and the signal lines LLa1, LLb1, and LLd1, and cathodes thereof are connected to ends of the resistors 303a, 303b, and 303d. The other ends of the resistors 303a, 303b, and 303d are connected to the ground potential. Cathode voltages of the diodes 302a, 302b, and 302d change depending on connection states (normal, open, and short circuit) of the microphones 21a, 21b, and 21d via the signal lines LLa1, LLb1, and LLd1. That is, the connection states (normal, open, and short circuit) of the microphones 21a, 21b, and 21d can be detected by monitoring the cathode voltages of the diodes 302a, 302b, and 302d.

The amplifier circuits 314a, 314b, and 314d include capacitors 304a, 304b, and 304d, capacitors 305a, 305b, and 305d, operational amplifiers 306a, 306b, and 306d, and capacitors 308a, 308b, and 308d, respectively. Each of the operational amplifiers 306a, 306b, and 306d operates by receiving the power supply voltage Vcc at a power supply node. The operational amplifiers 306a, 306b, and 306d amplify the levels of the voice signals transmitted from the signal lines LLa1, LLb1, and LLd1 via the capacitors 304a, 304b, and 304d and the capacitors 305a, 305b, and 305d to predetermined levels, respectively. The operational amplifiers 306a, 306b, and 306d supply the amplified signals to the voice processors 311a, 311b, and 311d via the capacitors 308a, 308b, and 308d, respectively. Each of the voice processors 311a, 311b, and 311d extracts a signal component from the supplied signal, and generates an output voice signal. Each of the voice processors 311a, 311b, and 311d outputs voice in accordance with the output voice signal from a speaker (not illustrated). Furthermore, the voice processors 311a, 311b, and 311d generate operation commands in accordance with the output voice signals, and transmit the operation commands to a device. This allows operation of the device based on input voice.

FIG. 4 illustrates a case where three microphones 11a, 11b, and 11c are necessary for ANC, three microphones 21a, 21b, and 21d are necessary for signal processing, and a total of six microphones are necessary. In the vehicle, the ANC unit 1002 is disposed between the microphones 11a, 11b, and 11c, the microphones 21a, 21b, and 21d, and the signal processing unit 1003. Therefore, the three microphones 11a, 11b, and 11c and the ANC unit 1002 are connected by six short signal lines La1, La2, Lb1, Lb2, Lc1, and Lc2. The three microphones 21a, 21b, and 21c and the signal processing unit 1003 are connected by six long signal lines LLa1, LLa2, LLb1, LLb2, LLd1, and LLd2.

For example, the microphones 11a, 11b, and 11c are required to have flatness of levels and phases in a low frequency region, and characteristics in a high frequency region are not considered in some cases. In contrast, in many cases, the flatness of levels and phases in a low frequency region, which is required for the microphones 11a, 11b, and 11c, is not considered for the microphones 21a, 21b, and 21d. Conversely, requirements of the characteristics in a high frequency region have been severely increased year by year as represented by international standards such as ITU-T.

When the number of microphones is increased for improving performance, the number of signal lines to be connected to the ANC unit 1002 or the signal processing unit 1003 increases, and wiring concentration cannot be avoided. The wiring concentration due to long signal lines to the signal processing unit in the subsequent stage and the like may hinder arrangement of wire harnesses.

Thus, in the embodiment, the acoustic processing apparatus is configured such that an output level of a microphone and an output level of an ANC unit 2 are equal to each other, which allows the dependent connection between the ANC unit and the signal processing unit. The number of microphones is reduced. The wiring concentration on the signal processing unit is reduced. Disconnection for each microphone and each unit is detected.

Figure 1:
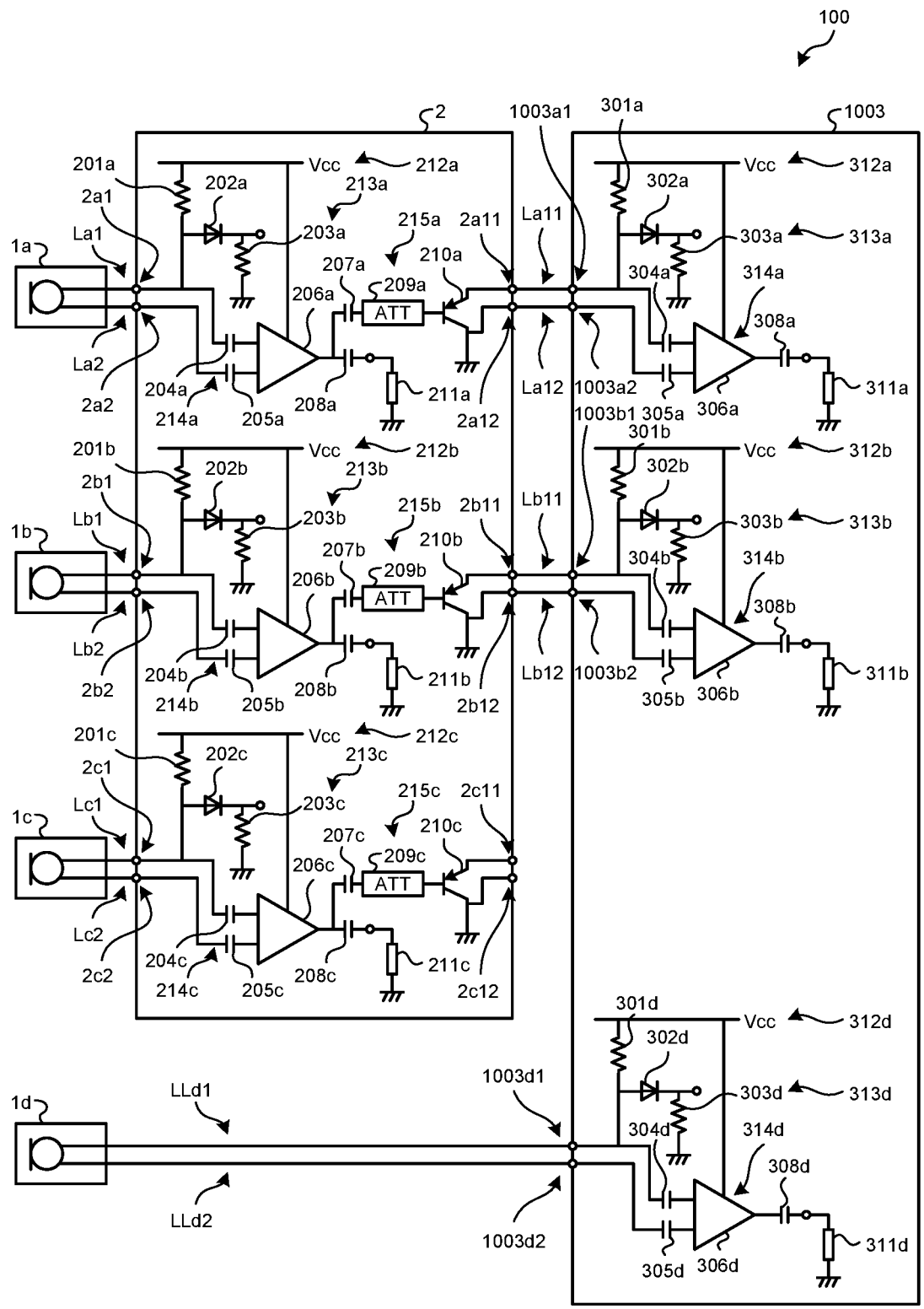
FIG. 1 is a circuit diagram illustrating a configuration of an acoustic processing apparatus according to an embodiment.

Specifically, an acoustic processing apparatus 100 can be configured as illustrated in FIG. 1. FIG. 1 illustrates a configuration of the acoustic processing apparatus 100. Portions different from the acoustic processing apparatus 1000 in FIG. 4 will be mainly described below.

The acoustic processing apparatus 100 includes microphones 1a, 1b, 1c, and 1d and an ANC unit (second voice processing unit) 2 instead of the microphones 11a, 11b, and 11c, the microphones 21a, 21b, and 21d, and the ANC unit 1002 (see FIG. 4). The ANC unit 2 is disposed between the microphones 1a, 1b, 1c, and 1d and a signal processing unit (first voice processing unit) 1003.

The microphones 1a, 1b, 1c, and 1d have both characteristics required for the ANC unit 2 and characteristics required for the signal processing unit 1003. The microphones 1a, 1b, 1c, and 1d are of types in which power is supplied from the outside for operation, and are, for example, capacitor-type microphones. The microphones 1a, 1b, 1c, and 1d share signal lines La1, La2, Lb1, Lb2, Lc1, Lc2, LLd1, and LLd2 for a power supply and a microphone output.

FIG. 1 illustrates a configuration in which the microphones 1a and 1b are used for ANC and signal processing, the microphone 1c is used for ANC, and the microphone 1d is used for signal processing. The ANC unit 2 and the signal processing unit 1003 are dependently connected to output sides of the microphones 1a and 1b. As a result, three microphones 1a, 1b, and 1c are used for ANC and three microphones 1a, 1b, and 1d are used for signal processing. The number of microphones is suppressed to four in total. That is, the configuration of FIG. 1 can reduce the number of microphones as compared with that in the configuration of FIG. 4.

Furthermore, in the configuration of FIG. 1, the microphones 1a and 1b and the ANC unit 2 are connected via four short signal lines La1, La2, Lb1, and Lb2, and the ANC unit 2 and the signal processing unit 1003 are connected via four short signal lines La11, La12, Lb11, and Lb12. When viewed from the signal processing unit 1003, four signal lines out of six signal lines are replaced from long signal lines (LLa1, LLa2, LLb1, and LLb2) to short signal lines (La11, La12, Lb11, and Lb12). This can reduce wiring drawing to the signal processing unit 1003. That is, in the configuration of FIG. 1, wiring concentration on the signal processing unit 1003 can be reduced as compared with the configuration of FIG. 4.

The ANC unit 2 includes adjustment circuits 215a, 215b, and 215c and output terminals 2a11, 2a12, 2b11, 2b12, 2c11, and 2c12 in addition to the phantom power supply circuits 212a, 212b, and 212c, the disconnection detection circuits 213a, 213b, and 213c, the amplifier circuits 214a, 214b, and 214c, and the voice processors 211a, 211b, and 211c (see FIG. 4). The adjustment circuits 215a, 215b, and 215c make adjustments such that output levels of the ANC unit 2 are equal to output levels of the microphones 1a, 1b, and 1c, respectively. Each of the adjustment circuits 215a, 215b, and 215c is connected to the signal processing unit 1003 via the output terminals 2a11, 2a12, 2b11, 2b12, 2c11, and 2c12 and the signal lines La11, La12, Lb11, Lb12, Lc11, and Lc12.

The adjustment circuits 215a, 215b, and 215c include capacitors 207a, 207b, and 207c, attenuators 209a, 209b, and 209c, and transistors 210a, 210b, and 210c, respectively. The capacitors 207a, 207b, and 207c are connected to output nodes of the operational amplifiers 206a, 206b, and 206c at ends thereof, and connected to the attenuators 209a, 209b, and 209c at the other ends, respectively. The attenuators 209a, 209b, and 209c are connected to the capacitors 207a, 207b, and 207c at ends thereof, and connected to the transistors 210a, 210b, and 210c at the other ends.

The transistors 210a, 210b, and 210c are, for example, PNP bipolar transistors, and are connected to the output terminals 2a11, 2b11, and 2c11 by open emitter connection. That is, bases of the transistors 210a, 210b, and 210c are connected to the attenuators 209a, 209b, and 209c. Emitters thereof are connected to the output terminals 2a11, 2b11, and 2c11. Collectors thereof are connected to the ground potential and the output terminals 2a12, 2b12, and 2c12. Emitters of the transistors 210a and 210b are connected to the signal processing unit 1003 via the output terminals 2a11 and 2b11 and the signal lines La11 and Lb11. Collectors thereof are connected to the signal processing unit 1003 via the output terminals 2a12 and 2b12 and the signal lines La12 and Lb12. A collector and an emitter of the transistor 210c are not connected to the signal processing unit 1003.

In this case, the attenuators 209a, 209b, and 209c have attenuation amounts in accordance with amounts of signals amplified by the operational amplifiers 206a, 206b, and 206c. For example, the attenuators 209a, 209b, and 209c have attenuation amounts that cancel the amounts of signals amplified by the operational amplifiers 206a, 206b, and 206c. This allows output levels of signals transmitted through the attenuators 209a, 209b, and 209c via the transistors 210a, 210b, and 210c to the output terminals 2a11, 2a12, 2b11, 2b12, 2c11, and 2c12 to be set to levels close to output levels of the microphones 1a, 1b, and 1c. As a result, the output levels of the microphones 1a, 1b, and 1c and the output level of the ANC unit 2 can be made equal to each other.

Furthermore, the attenuators 209a, 209b, and 209c are configured such that input impedances thereof are equal to input impedances of the voice processors 211a, 211b, and 211c.

For example, the output levels of the microphones 1a, 1b, and 1c are assumed to be −20 dBV. The operational amplifiers 206a, 206b, and 206c make amplifications to levels suitable for voice signals consumed in the ANC unit 2. Outputs of the operational amplifiers 206a, 206b, and 206c are divided into two branches. One of the branches is input to the voice processors 211a to 211c with a predetermined input impedance, and the other is input to the attenuators 209a to 209c with a predetermined input impedance.

In this case, the attenuators 209a, 209b, and 209c can be configured by connecting a plurality of resistors in a Π type or a T type. In the Π type or T type configuration, the input impedances of the attenuators 209a, 209b, and 209c can be made equal to the input impedance of the voice processor 211a by adjusting a resistance value of each resistor. This can prevent the output levels of the operational amplifiers 206a, 206b, and 206c from changing between a case where the signal processing unit 1003 is connected after the transistors 210a to 210c and a case where the signal processing unit 1003 is not connected.

Furthermore, the attenuation amounts of the attenuators 209a, 209b, and 209c can be adjusted such that the output levels of the microphones 1a, 1b, and 1c and the output level of the ANC unit 2 are equal to each other. For example, in the Π type or T type configuration of the attenuators 209a, 209b, and 209c, the output levels of the transistors 210a, 210b, and 210c can be made equal to the output levels of the microphones 1a, 1b, and 1c by adjusting a resistance value of each resistor. For example, the attenuation amounts of the attenuators 209a to 209c can be set such that the output levels of the transistors 210a to 210c are −20 dBV.

Furthermore, the output levels of the transistors 210a, 210b, and 210c can be made equal to the output levels of the microphones 1a, 1b, and 1c. Thus, when the ANC unit 2 is viewed from the signal processing unit 1003, the levels of the connected signals can be made equal in both a case where the microphones are connected and a case where the microphones are connected via the ANC unit 2. This allows each of the ANC unit 2 and the signal processing unit 1003 to stably operate in both a case where the ANC unit 2 and the signal processing unit 1003 are dependently connected to the output sides of the microphones 1a, 1b, 1c, and 1d and a case where the signal processing unit 1003 is directly connected.

For example, since the operation points of the microphones 1a, 1b, 1c, and 1d can be prevented from changing, the connection states (normal, open, and short circuit) of the microphones 1a, 1b, and 1c can be appropriately detected by monitoring the cathode voltages of the diodes 202a, 202b, and 202c in the disconnection detection circuits 213a, 213b, and 213c. The connection states (normal, open, and short circuit) of the ANC unit 2 can be appropriately detected by monitoring the cathode voltages of the diodes 302a, 302b, and 302d in the disconnection detection circuits 313a, 313b, and 313d.

As described above, in the embodiment, the acoustic processing apparatus 100 is configured such that output levels of the microphones 1a to 1d and the output level of the ANC unit 2 are equal to each other. This allows the ANC unit 2 and the signal processing unit 1003 to be dependently connected to the output sides of the microphones 1a to 1d, so that the number of microphones can be reduced and wiring concentration on the signal processing unit 1003 can be reduced. Furthermore, disconnection can be detected by the microphones and an individual channel of the ANC unit 2.

Note that, in a case where noise control is desired to be enhanced, the ANC unit 2 may be dependently connected between a microphone 1 and the signal processing unit 1003 in a plurality of stages.

Furthermore, the operational amplifiers 206a, 206b, 206c, 306a, 306b, and 306d can also be achieved by single-ended input configuration instead of differential input configuration.

Figure 2:
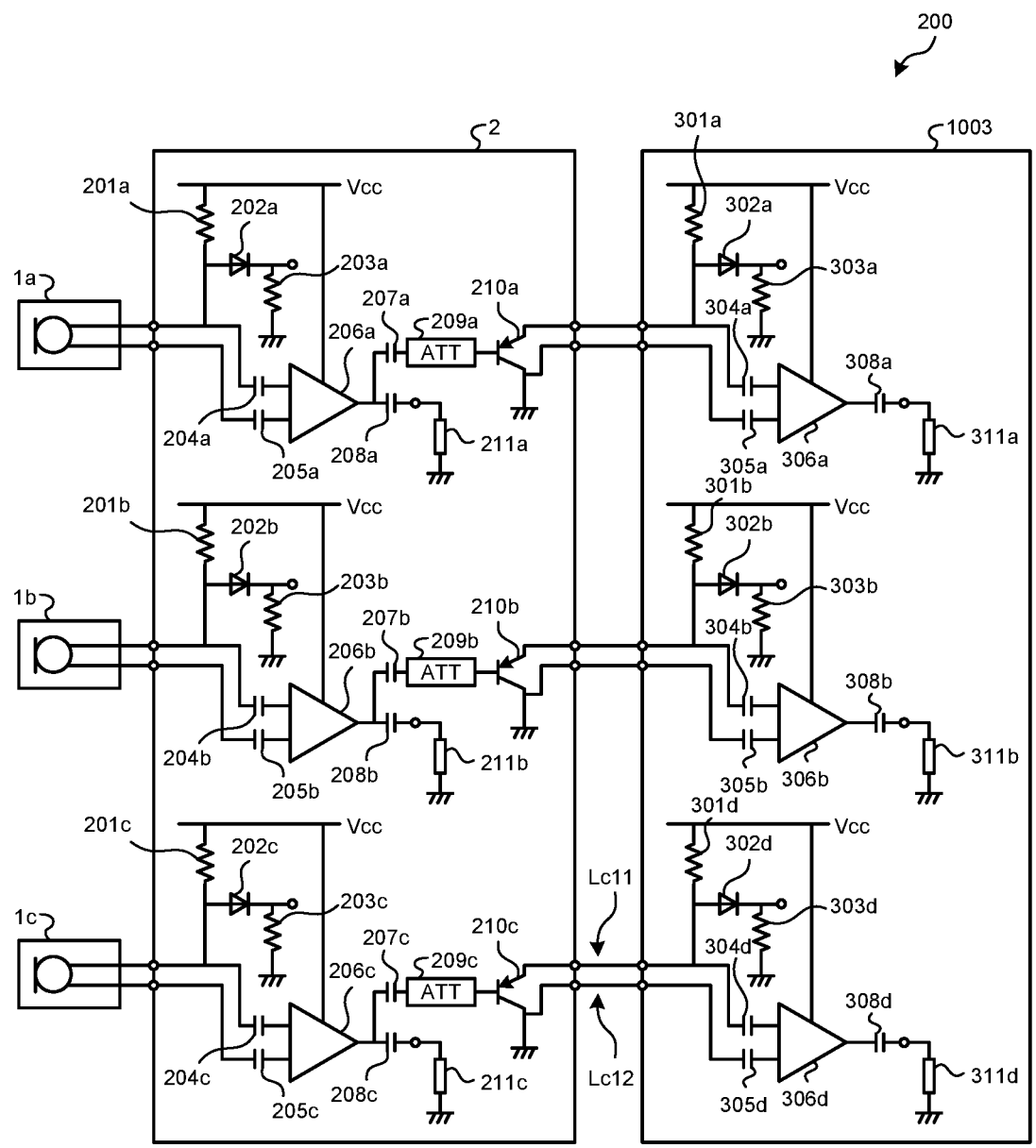
FIG. 2 is a circuit diagram illustrating a configuration of an acoustic processing apparatus according to a first modification of the embodiment.

Furthermore, when the microphone 1c can be substituted for the microphone 1d, an acoustic processing apparatus 200 may have configuration in which the ANC unit 2 and the signal processing unit 1003 are dependently connected to the output side of the microphone 1c as illustrated in FIG. 2. This can further reduce the number of microphones, and further reduce the wiring concentration on the signal processing unit 1003. For example, the four microphones 1a to 1d in FIG. 1 can be reduced to the three microphones 1a to 1c in FIG. 2. The present disclosure provides an acoustic processing apparatus enabling the number of microphones to be reduced. The long signal lines LLd1 and LLd2 in FIG. 1 can be replaced with the short signal lines Lc11 and Lc12 in FIG. 2 to further reduce the wiring drawing to the signal processing unit 1003.

Figure 3:
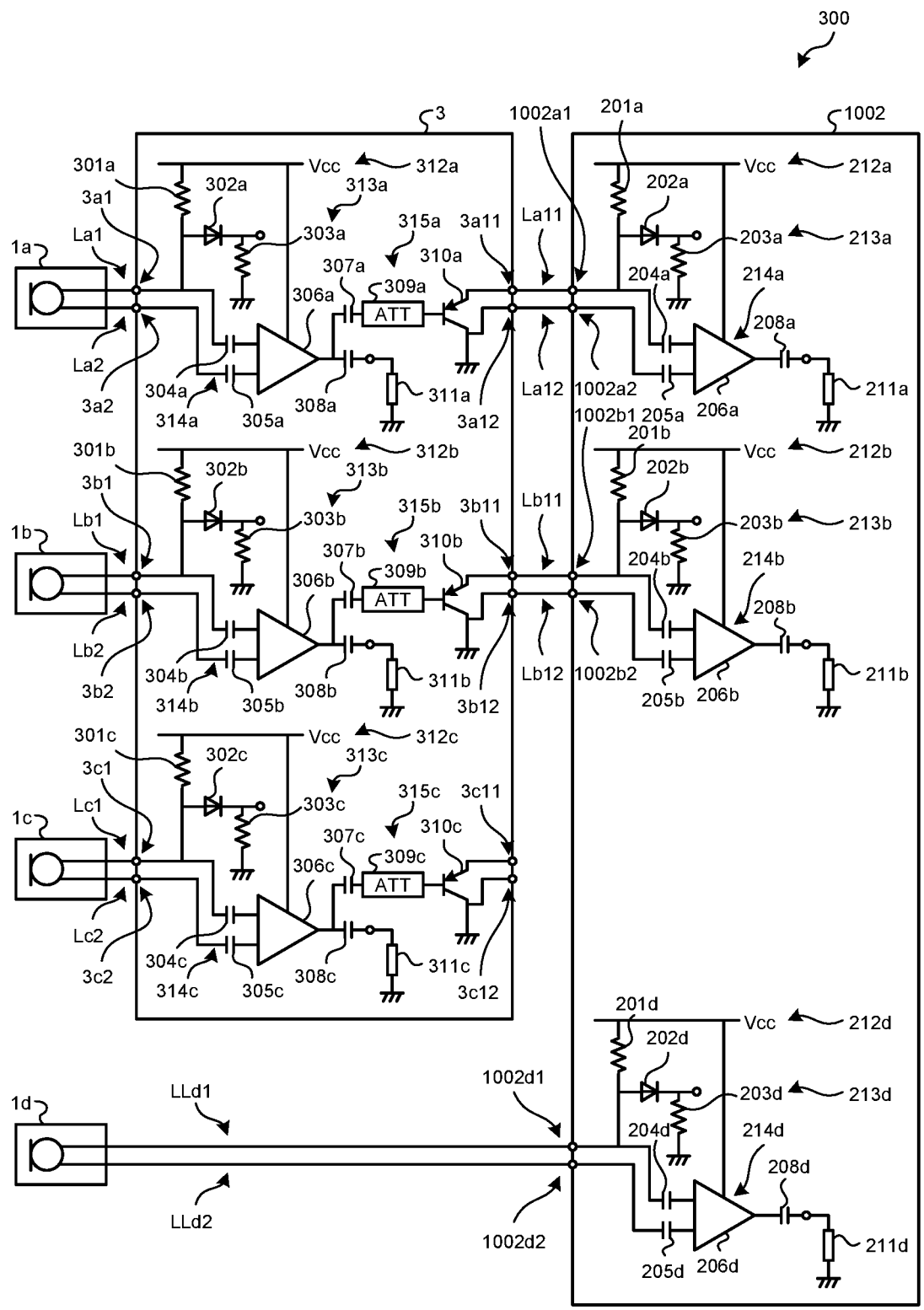
FIG. 3 is a circuit diagram illustrating a configuration of an acoustic processing apparatus according to a second modification of the embodiment.

Although, in the embodiment and the modifications thereof, a configuration in which the ANC unit 2 is disposed in the preceding stage of the signal processing unit 1003 has been illustrated, an acoustic processing apparatus 300 may have a configuration in which a signal processing unit 3 is disposed in the preceding stage of the ANC unit 1002 as illustrated in FIG. 3. For example, the acoustic processing apparatus 300 in FIG. 3 includes the microphones 1a, 1b, 1c, and 1d and a signal processing unit (second voice processing unit) 3 instead of the microphones 11a, 11b, and 11c, the microphones 21a, 21b, and 21d, and the signal processing unit 1003 (see FIG. 4). The signal processing unit 3 is disposed between the microphones 1a, 1b, 1c, and 1d and the ANC unit (first voice processing unit) 1002. The ANC unit 1002 is similar to the ANC unit 1002 in FIG. 4. The signal processing unit 3 is obtained by adding a change, which is similar to the change added to the ANC unit 1002 to obtain the ANC unit 2 in the embodiment, to the signal processing unit 1003 (see FIG. 4). The signal processing unit 3 includes adjustment circuits 315a, 315b, and 315c and output terminals 3a11, 3a12, 3b11, 3b12, 3c11, and 3c12 in addition to the phantom power supply circuits 312a, 312b, and 312c, the disconnection detection circuits 313a, 313b, and 313c, the amplifier circuits 314a, 314b, and 314c, and the voice processors 311a, 311b, and 311c (see FIG. 4). The adjustment circuits 315a, 315b, and 315c make adjustments such that output levels of the signal processing unit 3 are equal to output levels of the microphones 1a, 1b, and 1c, respectively. The adjustment circuits 315a, 315b, and 315c include capacitors 307a, 307b, and 307c, attenuators 309a, 309b, and 309c, and transistors 310a, 310b, and 310c, respectively. Since details of each configuration are similar to those in the embodiment, the description thereof will be omitted.

Although some embodiments of the present invention have been described, these embodiments have been presented as examples, and are not intended to limit the scope of the invention. These embodiments can be implemented in various other forms, and various omissions, substitutions, and changes can be made without departing from the gist of the invention. These embodiments and modifications thereof are included in the scope and gist of the invention, and are also included in the invention set forth in the claims and the equivalent scope thereof.

What is claimed is:

1. An acoustic processing apparatus, comprising:
one or more microphones;
a first voice processor; and
a second voice processor that is connected between some or all of the microphones and the first voice processor, wherein
the second voice processor comprises:
an operational amplifier;
an output terminal that is connected to the first voice processor;
an attenuator electrically connected between an output node of the operational amplifier and the output terminal; and
a voice processor electrically connected to the output node of the operational amplifier, and
a first input impedance of the voice processor is equal to a second input impedance of the attenuator.

2. The acoustic processing apparatus according to claim 1, wherein
the attenuator has an attenuation amount in accordance with an amplification amount of the operational amplifier.

3. The acoustic processing apparatus according to claim 1, wherein
each of the one or more microphones is of a capacitor type, and
the second voice processor further comprises a transistor that is disposed between the attenuator and the output terminal and connected to the output terminal by open emitter connection.

4. The acoustic processing apparatus according to claim 3, wherein
a base of the transistor is electrically connected to the attenuator, an emitter of the transistor is electrically connected to the output terminal, and a collector of the transistor is electrically connected to a ground potential.

5. An acoustic processing apparatus, comprising:
one or more microphones;
a first voice processor; and a second voice processor that is disposed between some or all of the microphones and the first voice processor, wherein the second voice processor comprises:

an operational amplifier;

an output terminal that is connected to the first voice processor;

an attenuator electrically connected between an output node of the operational amplifier and the output terminal; and a voice processor electrically connected to the output node of the operational amplifier, and a first input impedance of the voice processor is equal to a second input impedance of the attenuator.

6. The acoustic processing apparatus according to claim 5, wherein the attenuator has an attenuation amount in accordance with an amplification amount of the operational amplifier.

7. The acoustic processing apparatus according to claim 5, wherein each of the one or more microphones is of a capacitor type, and the second voice processor further comprises a transistor that is disposed between the attenuator and the output terminal and connected to the output terminal by open emitter connection.

8. The acoustic processing apparatus according to claim 5, wherein a base of the transistor is electrically connected to the attenuator, an emitter of the transistor is electrically connected to the output terminal, and a collector of the transistor is electrically connected to a ground potential.

* * * * *